United States Patent [19]

Mok

[11] Patent Number: 5,201,866
[45] Date of Patent: Apr. 13, 1993

[54] STRUCTURE FOR DISSIPATION OF HEAT HAVING SLIDABLY ENGAGED FINS FOR CONFORMAL DISPOSITION AGAINST A HEAT GENERATING SURFACE

[75] Inventor: Lawrence S. Mok, Yorktown Heights, N.Y.

[73] Assignee: International Business Machines Corporation, Armonk, N.Y.

[21] Appl. No.: 829,862

[22] Filed: Feb. 3, 1992

[51] Int. Cl.⁵ .......................... F28F 7/00; H05K 7/20
[52] U.S. Cl. .................................. 165/80.3; 165/185; 361/386; 361/388; 361/383; 257/712
[58] Field of Search .................. 165/80.2, 80.3, 185; 361/383, 386, 388; 357/81

[56] References Cited

U.S. PATENT DOCUMENTS

| | | | |
|---|---|---|---|
| 2,328,488 | 8/1943 | Peters | 357/11 |
| 2,416,152 | 2/1947 | Braun | 357/82 |
| 2,772,382 | 11/1956 | Escoffery | 357/81 |
| 3,180,404 | 4/1965 | Nelson et al. | 165/47 |
| 3,449,172 | 6/1969 | Dingwall | 136/202 |
| 3,548,927 | 12/1970 | Spurling | 165/80.3 |
| 4,156,458 | 5/1979 | Chu et al. | 165/185 |
| 4,169,642 | 10/1979 | Mouissie | 361/383 |
| 4,235,283 | 11/1980 | Gupta | 165/185 |
| 4,254,431 | 3/1981 | Babuka et al. | 357/82 |
| 4,261,005 | 4/1981 | McCarthy | 357/81 |
| 4,263,965 | 4/1981 | Mansuria et al. | 165/80.4 |
| 4,408,220 | 10/1983 | Calabro | 357/81 |
| 4,481,525 | 11/1984 | Calabro et al. | 357/81 |
| 4,485,429 | 11/1984 | Mittal | 361/386 |
| 4,535,841 | 8/1985 | Kok | 165/80.3 |
| 4,605,058 | 8/1986 | Wilens | 165/80.2 |
| 4,639,829 | 1/1987 | Ostergren et al. | 361/386 |
| 4,660,123 | 4/1987 | Hermann et al. | 361/386 |
| 4,689,720 | 8/1987 | Daszkowski | 361/386 |
| 4,691,765 | 9/1987 | Wozniczka | 165/80.3 |
| 4,707,726 | 11/1987 | Tinder | 357/81 |
| 4,710,852 | 12/1987 | Keen | 361/386 |
| 4,712,159 | 12/1987 | Clemens | 361/386 |
| 4,730,666 | 3/1988 | Flint et al. | 165/80.4 |
| 4,745,456 | 5/1988 | Clemens | 357/79 |
| 4,770,242 | 9/1988 | Daikoku et al. | 165/185 |
| 4,872,505 | 10/1989 | Jones et al. | 165/80.3 |
| 4,884,631 | 12/1989 | Rippel | 165/185 |
| 4,922,601 | 5/1990 | Mikolajczak | 29/450 |
| 4,964,458 | 10/1990 | Flint et al. | 165/80.4 |
| 4,970,579 | 11/1990 | Arldt et al. | 357/81 |
| 5,014,117 | 5/1991 | Horvath et al. | 361/386 |
| 5,031,069 | 7/1991 | Anderson | 361/386 |
| 5,099,550 | 3/1992 | Beane et al. | 361/388 |

FOREIGN PATENT DOCUMENTS

| | | | |
|---|---|---|---|
| 1360420 | 3/1989 | France. | |
| 1163126 | 6/1985 | U.S.S.R. | 165/185 |

OTHER PUBLICATIONS

Eckenbach et al., "Semiconductor Module with Heat Transfer", IBM Technical Disclosure Bulletin, vol. 20, No. 12, May 1978, p. 5203.

(List continued on next page.)

Primary Examiner—John Rivell
Assistant Examiner—L. R. Leo
Attorney, Agent, or Firm—Daniel P. Morris

[57] ABSTRACT

Heat dissipation structures formed from folded sheet metal are described. The structure permits close thermal contact to a heat generating surface by permitting independent movement of fins or fin assemblies. The fin assemblies are spring biased towards the heat generating surface by a spring means which is disposed between the tops of the fin assemblies and a cover which forms a duct surrounding the fin assemblies for holding the fin assemblies together and for permitting a fluid, such as air, to be channeled over the fin assemblies. The cover has grips for gripping onto the side portions of the heat generating surface. Furthermore, the cover has means for gripping onto the spring bias means for fixedly attaching it thereto. Furthermore, the fin assemblies have means for engaging with the bias means for holding the fin assemblies in fixed special relation with the spring bias means. The fin assemblies, spring bias means and cover form a unitary structure which can be detachably mounted or snap fit onto a heat generating surface, such as a semiconductor chip module.

20 Claims, 8 Drawing Sheets

OTHER PUBLICATIONS

Furkay et al., "Clip-on Module Thermal Capacitor", IBM Technical Disclosure Bulletin, vol. 27, No. 3, Aug. 1984, p. 1779.

IBM Technical Disclosure Bulletin, vol. 26, No. 7A Dec., 1983 pp. 3233-3234, Horvath et al. Metal Cooling Fins for a Semiconductor Package.

IBM Technical Disclosure Bulletin, vol. 10, No. 8, Jan., 1968 Mulligan, Snap-On Heat Exchanger.

IBM Technical Disclosure Bulletin, vol. 32, No. 9B, Feb., 1990 Snyder et al., Heat Transfer Structure for Semirigidly Mounted, p. 408.

Research Disclosure Oct. 1990, No. 318, Spring-Loaded Heat Sinks For VLSI Packages, K. Mason Publications, Ltd., England.

Research Disclosure, May, 1986, No. 265, Flexible Shell Conduction/Conversion Cooling Device, K. Mason Publications Ltd., England.

STRUCTURE FOR DISSIPATION OF HEAT HAVING SLIDABLY ENGAGED FINS FOR CONFORMAL DISPOSITION AGAINST A HEAT GENERATING SURFACE

FIELD OF THE INVENTION

This invention relates to structures for dissipating heat generated at a surface wherein the structures have a base and fin-like-members and wherein some of the fin-like-members are disposed adjacent each other so that at least a part of the adjacent fin like members are slidably engaged with respect to each other to permit the base of each fin like member to conform to the heat generating surface. In a more particular aspect of the present invention, the fin-like-members are part of discrete fin assemblies disposed for adjacent slidable engagement. More particularly, the base of each fin-like-member is disposed in thermal contact with the heat generating surface by for as applied to the fin-like-members. More particularly, the structure has a housing partially enclosing the fin-like-members with the spring biased means disposed between the housing and the fin like members. More particularly, the housing has a duct shape permitting a fluid heat transfer medium to flow between the fin-like-members. Most particularly, the structure of the present invention is for dissipating heat generated by an electronic device.

BACKGROUND OF THE INVENTION

Heat sinks for dissipating heat generated by electronic device such as semiconductor chips or semiconductor chip packaging substrates such as used in electronic computers have a substantial history. A driving force behind continued investigation of improved heat sinks is to dissipate more heat per unit area generated by advanced very large scale integrated semiconductor chips which contain increasingly more heat generating circuits on a given area of the chip. Concomitantly, of equal importance, a driving force for continued investigation of heat sinks for semiconductor chips is reduction in the cost of fabrication of the heat sink to reduce the cost of the packaged semiconductor chip and correspondingly the cost of the electronic computer. Traditional heat sinks are commonly made from extrusion, casting and machining of materials most typically metals such as aluminum. Aluminum is a relatively inexpensive metal having a relatively high thermal conductivity. A machine aluminum heat sink is made from a block of aluminum from which portions are machined away. Machining is a time consuming and a labor intensive process which also does not maximally utilize the material. In extrusion, material is pushed through a form to make the shape of the desired heat sink. Extrusion requires costly machinery, and requires relatively large amounts of material to form the extruded part. In casting, molten material is poured into a cast having the shape of the desired part. Casting is an extensive labor intensive process which also utilizes more material than necessary to form the part.

Heat sinks generally have fins which are typically substantially planar members projecting away from a base. The fins do not have to be limited to this shape. Fins resulting from machining, extrusion and casting are not optimized thermally. Due to the nature of and natural limitations of machining, extrusion and casting the fins are typically thicker than a minimal thickness needed to be an effective heat dissipation means. The fins made by these methods generally have a thickness greater than about 1 mm. Moreover, the aspect ratio of the fins that is the ratio of the fin height to the thickness, is generally limited in these fabrication methods to less than about 20.

A fluid which can be a gas or a liquid, but typically air, is generally directed across the fins or between the fins to extract heat therefrom. When a gas is used there is generally a pressure drop at and between the heat sink fins as compared to the pressure at the output of the gas stream. This pressure drop is caused by the fins and the rest of the heat dissipation assembly providing resistive barriers to the fluid flow. This is generally caused by the following structure dimensions: the fin thickness, the fin height and the spacing between fins. The fin thickness provides a hard obstruction to the fluid flow; so does the fin height. As the spacing between the fins becomes smaller, there is less room for the fluid to flow between the fins; therefore, increasing the fluid flow resistance resulting in a decrease in the fluid pressure between the fins. In order to boost the cooling power of the heat sink while keeping the air drag low, thinner and higher aspect ratio fins need to be used.

By the traditional methods of machining, extrusion and casting it is difficult and expensive to make fins which are thin and have a high aspect ratio. Alternative methods to achieving high aspect ratio fin assemblies is to glue, to braze or to solder high aspect ratio sheets (fins) of thermally conducting material to a base. These methods, however, are costly since they require a relatively thick base material plate to hold the fins, relatively costly adhesive materials and relatively high assembly cost. In such a technique grooves are typically formed in the relatively thick base material into which the fins are inserted and flued, brazed or soldered thereto. Furthermore, the fin aspect ratio is also limited in these heat sinks by the dimensional instability of the thin fins. High aspect ratio fins having a minimum thickness are difficult to handle since they lack rigidity.

For any one of the above traditional types of heat sinks, the planarity of the heat sink surface which comes into contact with the heat generating surface will affect the thermal resistance therebetween. If the heat sink has a relatively large base which is not machined to a high degree of planar flatness and if the surface to which it is to be thermally connected to is not machined to a high degree of planar flatness, there will be substantial regions wherein there will be spaced between the heat sink base and the heat generating surface because of the lack of perfect flatness of each side. These spaces provide regions of high thermal resistance.

Applicants have discovered a heat dissipating structure which avoids the substantial costs of machining, extrusion, casting and adhesively attaching fins to a thick base plate by using folded sheets of thin sheet material. The heat dissipating structures of the present invention also avoid the problem of the lack of perfect planarity between the heat sink base and the heat generating surface. The present invention uses a design wherein fins or a fin assembly (group of fins) are slidably engaged with respect to an adjacent fin or fin assembly to permit the fin or fin assembly to be pressed into intimate thermal contact with the heat generating surface and to thereby have a substantially improved conformal and thermal conduction thereto.

The structures of the present invention have fins for dissipating heat which have a minimum thickness and a high aspect ratio and a minimum spacing therebetween.

It is an object of the present invention to provide a heat dissipation structure which can dissipate heat in excess of 4.0 watts per square centimeter by blowing air over the fins at a pressure of 18.0 N/m$^2$.

It is another object of the present invention to provide a heat dissipation structure which is substantially inexpensive to fabricate.

It is another object of the present invention to provide heat dissipation structures having fin assemblies wherein adjacent fin assemblies have parts thereof which are slidably engaged to each other to permit each assembly to be urged in substantially conformal thermal connection to a heat generating surface.

It is another object of the present invention to enclose the assembly of fins with a housing providing a duct-like structure to direct a fluid to pass over and between the fins by directing a fluid shown along a direction parallel to said fins.

It is another object of the present invention to provide a bias means between the housing the fins to urge the fins in conformal contact with the heat generating substrate.

The prior art structures described below show resilient sheet material folded into a serpentine or corrugated shape which is held between a duct-like-cap and a heat generating surface. The prior art structures however, do not have an optional thermal contact between the serpentine structure the heat generating surface. Some of these prior art serpentine structures are typically curved at the region of contact with the heat generating surface thereby having a relatively small region over which heat can transfer from the heat generating surface into the serpentine fin structure having flat regions which only cover approximately half of the heat generating surface. In contradistinction, the structures of the present invention have fin assemblies with bases which substantially completely cover the heat generating surface providing an optimal thermal connection between the heat generating surface and the fin assemblies. Moreover, since the fin assemblies of the present invention are permitted to move independently of each other there is achieved intimate thermal contact between the fin assemblies and the heat generating surface to substantially enhance the heat dissipation power of the structures of the present invention.

DESCRIPTION OF THE PRIOR ART

U.S. Pat. No. 2,772,382 shows a cover 26 for a stack of rectifier plates wherein the cover is bent into a corrugated shape to form upstanding fin elements. The cover is further bent to form shoulders 24 and 25 to cover the edges of the stack rectifier plates 11. The cover has a portion 34 which is folded under the stack rectifier plates to form a bottom portion. The top and bottom portions are held together by eyelets 38 and 39.

IBM Technical Disclosure Bulletin, Vol. 10, No. 8, January, 1968, p. 1242 shows a snap-on heat exchanger for dissipating heat from an enclosed electronic component where the heat exchanger is of unitary construction and typically formed from a copper sheet which can be folded into a finned member of desired form having folds permitting it to be snapped onto an edge of the electronic component for holding the heated exchanger in place on the electronic component.

U.S. Pat. No. 4,481,525 shows an IC chip 14 having a square grounding plate 24 on a top surface thereof which mates with an opening in a heat dissipating element 10 which is disposed thereon. The heat dissipating element 10 is held in place on the top surface of chip 14 by a heat conducting clamp 12 which is disposed under the chip 14 and has upstanding members 48 with flanges 50 at the end thereof for gripping onto the dissipating element 10.

U.S. Pat. No. 4,745,456 shows a heat dissipating element 24 formed from a plurality of longitudinally spaced fins 28 which project radially from a post which is disposed on surface 20 of housing 24 and held in place by heat sink clip 50 which is inserted between a pair of fins. The clip exerts a resilient force on the heat sink urging it into intimate thermal contact with pad 18 on the upper surface 20 of housing 14. The heat sink assembly can be quickly and easily disassemble by disengaging flanges 54 of the heat sink clip from a latching member 40 of the frame holding housing 14.

IBM Technical Disclosure Bulletin, Vol. 26, No. 7A, December 1983, p. 3233 shows metal cooling fins for a semiconductor chip package formed of a high thermal conductivity metal plate with a plurality of parallel overlapping slots which is bent into a serpentine shape. The slotted structure separates the bond interface into small areas, thereby distributing the bond areas and allowing each area to expand separately to avoid the collective expansion of the fin bond interface.

IBM Technical Disclosure Bulletin, Vol, 32, No. 9B, February, 1990, p. 408 shows fin structure 5 formed from 0.2 mm copper or 0.5 mm CoIn/Cu. The structure 5 is soldered onto a thick base plate 6 which is disposed in thermal contact with chip 2.

U.S. Pat. No. 2,328,488 shows corrugated member 16 of a resilient material which permits efficient cooling of rectifiers and which are disposed between base plates 10 of the rectifying elements.

U.S. Pat. No. 2,416,152 shows corrugated spacer 18 consisting of two thin strips of copper which are disposed between adjacent rectifier plates and transversely of the direction of air flow so that they do not materially interfere with the flow of cooling air through the stacked rectifier plates.

U.S. Pat. No. 3,449,172 shows, in FIG. 2, a prepunched folded metal foil 25, normally of 2-5 mil. copper which provides there dimensional flexibility in connector 17 shown in FIG. 1 disposed between hot sink 11 and cold sink 13.

U.S. Pat. No. 3,180,404 shows, in FIG. 3; a plate 51 mounted on a heat producing element 52 to conduct heat therefrom; undulating fin strips 53 braised or otherwise secured to the upper surface of plate 51; cover plate 49 contacting the upper surfaces of the fin strips wherein the cover operates with plate 51 in defining a duct for a confined flow of coolant over the corrugated fin strip 53. The corrugated fin strip 41 of FIG. 8 is made of a thin ductile sheet material gathered in an undulating configuration to provide lower surfaces and upper surfaces extending longitudinally of plate 39.

U.S. Pat. No. 4,884,631 shows a higher efficiency force air heat sink assembly employing a split transverse flow configuration containing in various embodiments thin structural material configurations including honeycomb, corrugated and serpentine configurations. The serpentine structured fin element employs a plurality of fin supports extending from the plate and forming a plurality of channels for receiving the fin structures.

Each of the embodiments uses a thermally conductive plate having exposed exterior surfaces; one for receiving the components to be cooled and one for receiving the fin structures.

U.S. Pat. No. 4,263,965 describes a plurality of separately spring biased thin leaf shaped members 21 which are free to move within individual recesses 20a so as to obtain relatively flat surface engagement of the thin leaf shaped member with the planar surface of the oppositely disposed chip 10. The thin leaf shaped members are thin rectangularly shaped members.

U.S. Pat. Nos. 4,730,666 and 4,964,458 show at FIG. 3 a thermally conductive sheet 38 in thermal contact with chips 22 wherein the sheet 38 has corrugations 44 in the regions between the chips to absorb differential thermal expansion and enhance the flexibility of sheet 38. Sheet 38 in the vicinity of the chips has groups of fins 40 wherein each group is pressed by pressure plate 46 and spring 48 towards the back of each chip to enhance the thermal contact between flexible sheet 38 and the back of each chip.

U.S. Pat. No. 4,408,220 describes a heat dissipator which is unitary in construction and formed of a resilient material to facilitate rapid mounting and subsequent removal from an IC package. The resilient heat exchanger provides thermal connection between a thermal plate and a dual in line integrated circuit package.

U.S. Pat. No. 4,707,726 describes an arrangement for mounting of package semiconductor with a heat sink which includes the heat sink having a channel formed therein with a pair of opposed sidewalls and utilizes one or more spring beams acting against one sidewall of the channel to urge the semiconductor package into good heat transferring relation or engagement with the other sidewall.

U.S. Pat. No. 4,922,601 described a heat assembly to dissipate heat from an electrical component to a housing. The structure includes a resilient biasing member which includes a plurality of resilient fingers which are coupled with a carrier mechanism to retain the carrier and the electrical component in position on the housing.

U.S. Pat. Nos. 4,605,058 and 4,872,505 describe heat sinks formed into a U-shaped members and W-shaped members respectively each having projections for engagement with apertures in the substrate.

Research Disclosure, October, 1990, No. 318, Kenneth Mason Publications Ltd. England, describes a rolled fin like spring between a top plate and a bottom plate wherein the bottom plate is thermally conducting and exposed against a semiconductor chip and wherein the top plate presses down on the spring to press the bottom plate into thermal contact with the semiconductor chip and wherein the top plate is held in place by snap-on heads on a frame which are inserted through holes in the thermal plate and through holes in the top plate to which they are fixedly held.

U.S. Pat. No. 4,970,579 describes a heat sink made out of folded sheet metal wherein the sheet must not be so thin as to be fragile or to create excessive thermal resistance, and should not be so thick as to result in unacceptable weight and cost. FIG. 7 shows an empirically developed plot of thermal resistance versus thermal conductivity multiplied by the heat sink's thickness. Thermal resistance is equal to temperature of the heat sink less the ambient temperature divided by the power dissipated in the chip.

U.S. Pat. No. 4,261,005 shows a one piece stamped sheet-metal heat sink for dissipation of heat which accumulates about a plastic housing. The heat sink has a symmetrical unitary structure which exhibits flexibility enabling it's inner edges to spread apart readily as a semiconductor package is pressed into the channel formed thereby and to spring back into position where the edges engage and hold the package.

U.S. Pat. No. 4,691,765 describes a heat sink positioned on a print circuit board wherein the heat sink has mounting tabs which are adapted for insertion within an aperture in the printed circuit board.

U.S. Pat. No. 4,712,159 shows a heat sink clip assembly releasably attaching a heat sink to an electronic device package. The clip assembly includes a nonconductive attachment clip which extends on the underside of the package as a latching engagement clip to a heat sink disposed adjacent the opposite side of the electronic package with the heat sink in thermal contact with the electronic device package.

Research Disclosure, May, 1986, No. 265, Kenneth Mason Publications Ltd., England, shows a metallic shell 1 having high thermal conductivity mounted onto a module 2 which is mounted onto a PC card 4. A card enclosure is placed over the entire PC card to cover the module. The shell 2 serves a thin surface conduction pad and the cover serves as a heat sink. The shell compresses when the enclosure 6 is closed increasing the contact area between the shell and the module. The shell material is thin so that it does not increase the air flow resistance of the assembly. The cover 6 has a duct shape permitting air flow therein and over the shell.

U.S. Pat. No. 4,639,829 shows a piston 23 spring biased towards the back of a semiconductor chip 20.

U.S. Pat. No. 4,254,431 shows a heat sink 26 having dendridic projections 30 thereon pressed by a plurality of springs 28 into engagement with dendridic projections 30 on the back of a semiconductor chip 12.

U.S. Pat. No. 4,770,242 shows a plurality of finned thermally conductive members 17 each disposed over a semiconductor chip 1. Fins of the thermally conductive member 17 intermesh with fins 16 of housing 15. The thermally conductive member 17 is biased by spring 20 towards semiconductor chip 1 and the spring is disposed between housing 15 and thermally conductive member 17.

U.S. Pat. No. 3,548,927 shows a resilient clip attached to a heat dissipating member. The clip has one or more spring elements bearing downwardly towards a central component retaining area. The clip is shaped in such a fashion that an electronic component can be slid under it and pressed by the spring clip in a direction towards the retaining area of the heat dissipating member and also the area at which the heat dissipating member is mounted on an appropriate heat sink.

U.S. Pat. No. 4,689,720 shows a thermal link utilizing spring metal to provide a thermal path between a heat source and a heat sink compensating for irregularities on the surface of the heat source and/or heat sink and/or nonuniformity in the spacing therebetween.

U.S. Pat. No. 4,710,852 shows a spring steel bayonet type retainer for securing encapsulated semiconductor devices to circuit boards either directly or through an intermediate heat dissipator.

SUMMARY OF THE INVENTION

In the broadest aspect the present invention, a structure is described for removing heat generated at a surface wherein the structure contains a plurality of fin assemblies having of fin-like-members and a base. At least some of the plurality of fin assemblies are disposed adjacent another fin assembly so at least a part of the adjacent parts of the fin assemblies are slidably engaged with respect to each other so that the base to which each of the fin-like-members are attached can be separately disposed in intimate thermal contact with the heat generating surface.

In a more specific aspect of the present invention, the fin-like-members are each part of a discrete fin assembly wherein each fin assembly has a base and wherein each of the fin assemblies has at least two fin members projecting away from the base. One of the plurality of discrete fin assemblies is disposed adjacent and another of the plurality of discrete fin assemblies so that corresponding fin members are slidably engaged with respect to each other.

In another more particular aspect of the present invention, the structure further has a housing for enclosing the fin assemblies wherein the housing forms a duct-like member permitting a heat conducting fluid medium to pass between and over the fins to extract heat therefrom.

In another more particular aspect of the present invention, between the housing and that part of the fin assemblies not disposed in contact with the heat generating surface there are a plurality of biasing means for urging the discrete fin assemblies towards the heat generating surface to permit intimate thermal contact between the base of the fin assemblies and the heat generating surface.

In another more particular aspect of the present invention the housing has clip means to clip onto the heat generating surface.

In another more particular aspect of the present invention the housing has grip means for gripping onto the biasing means.

These and other objects, features and advantages of the present invention will be readily apparent to those of skill in the art from the following specification and the appended claims and drawings.

DETAILED DESCRIPTION

Figure 1:
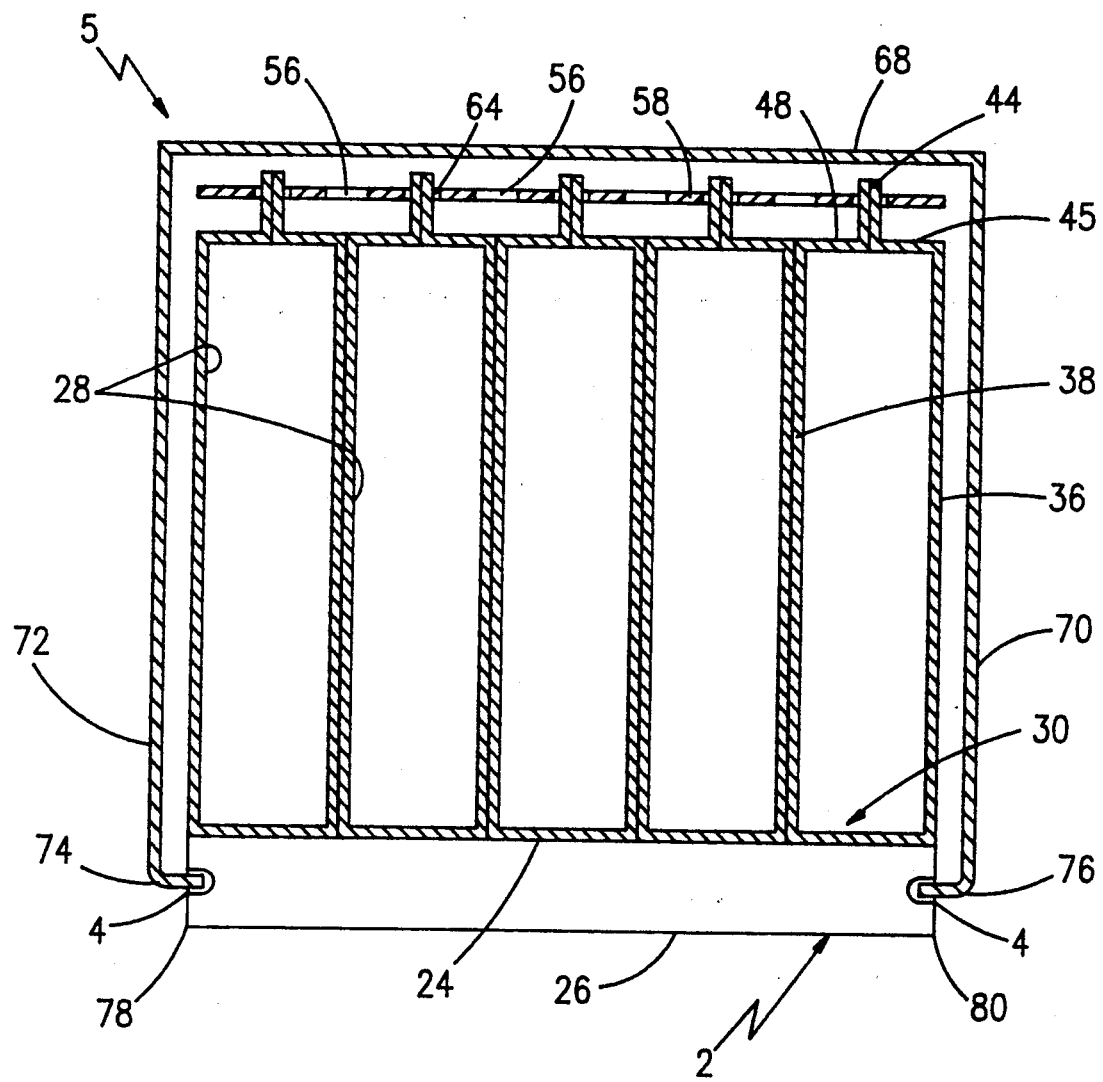
FIG. 1 shows a front view of one embodiment of the invention.
Figure 2:
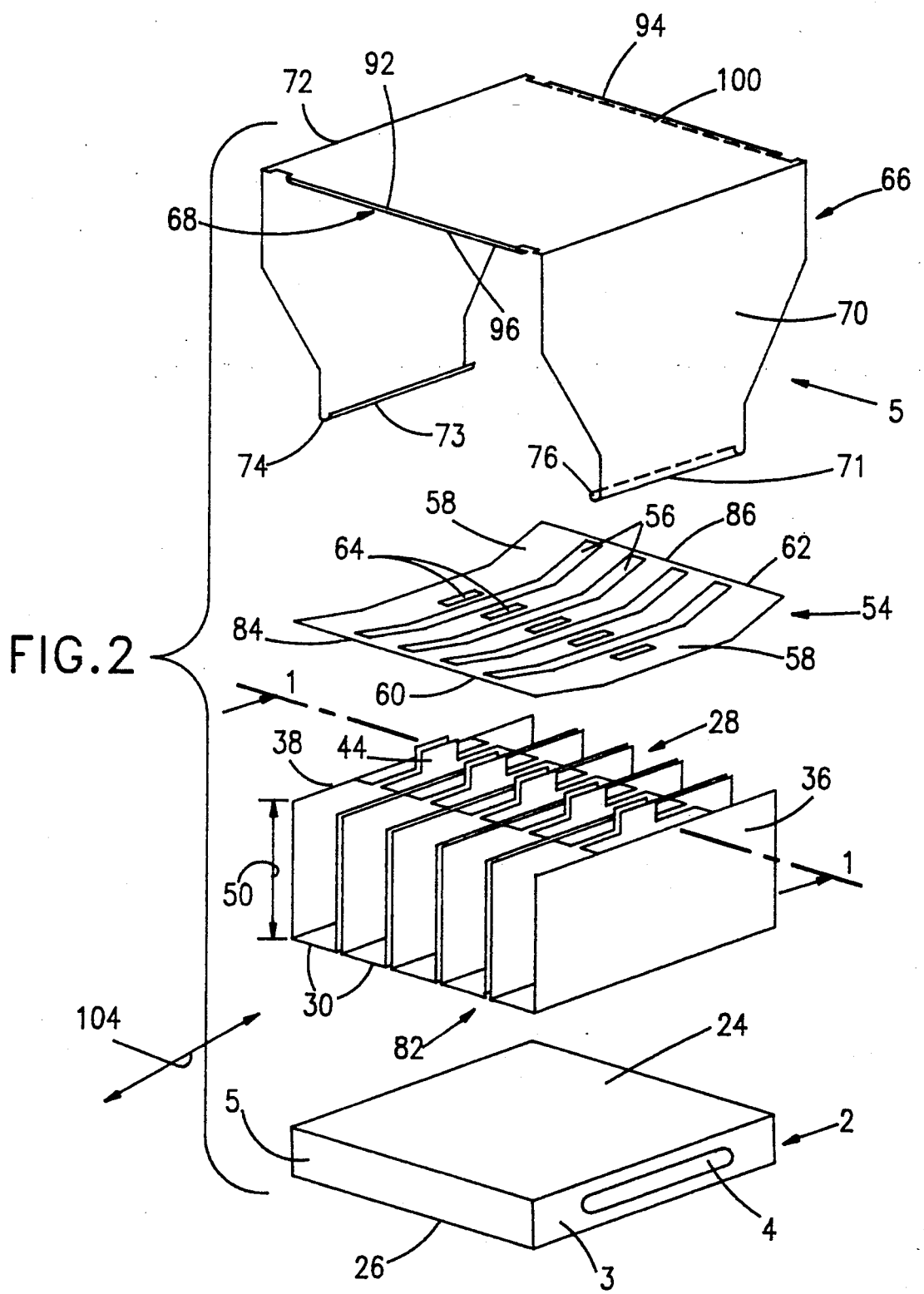
FIG. 2 shows a disassembled view in perspective of the embodiment of FIG. 1.
Figure 13:
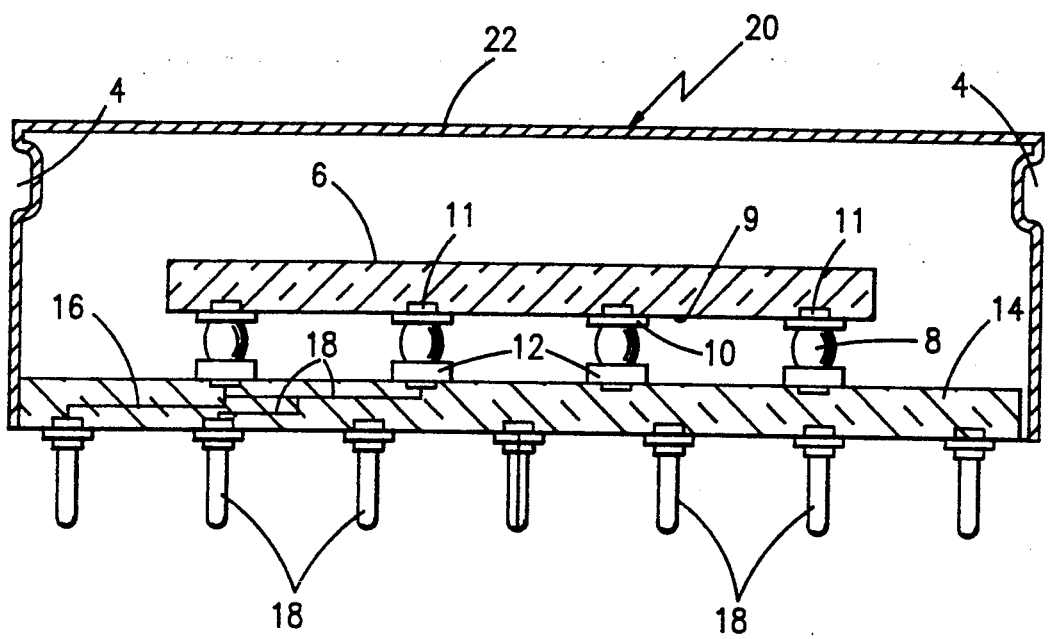
FIG. 13 shows a cross sectional side view of a semiconductor chip module.

FIG. 1 shows a cross section of an embodiment of the cooling structure of the present invention. FIG. 2 shows the structure of FIG. 1 in perspective and disassembled. The structure has a bottom plate 2 which has a groove 4 preferably along two opposite sides thereof. Plate 2 can be a cap of a semiconductor chip package containing one or more chips. FIG. 13 shows a cross sectional side view of an exemplary semiconductor chip package or module wherein a semiconductor chip 6 is mounted in a flip chip configuration on a substrate 14 with solder mounts 8 interconnecting chip pads 10 on chip surface 9 to substrate pads 12 on substrate 14. The chip pads 10 are electrically connected to chip metallization 11. Substrate 14 can be any dielectric material such as a ceramic having electrical conductor patterns 16 embedded therein to electrically connected substrate pads to pins 18. The chip 6 is enclosed by a cap 20 having a top surface 22. The plate 2 of FIGS. 1 and 2 can be the cap 22 of FIG. 13 such that surface 24 of plate 2 corresponds to surface 22 of FIG. 13. Alternatively, plate 2 of FIGS. 1 and 2 can be a separate piece wherein surface 26 of FIGS. 1 and 2 can be disposed on surface 22 of FIG. 13.

The structure of FIGS. 1 and 2 contains a plurality of fin assemblies 28. An individual one of the fin assemblies is shown in FIG. 3.

Figure 3:
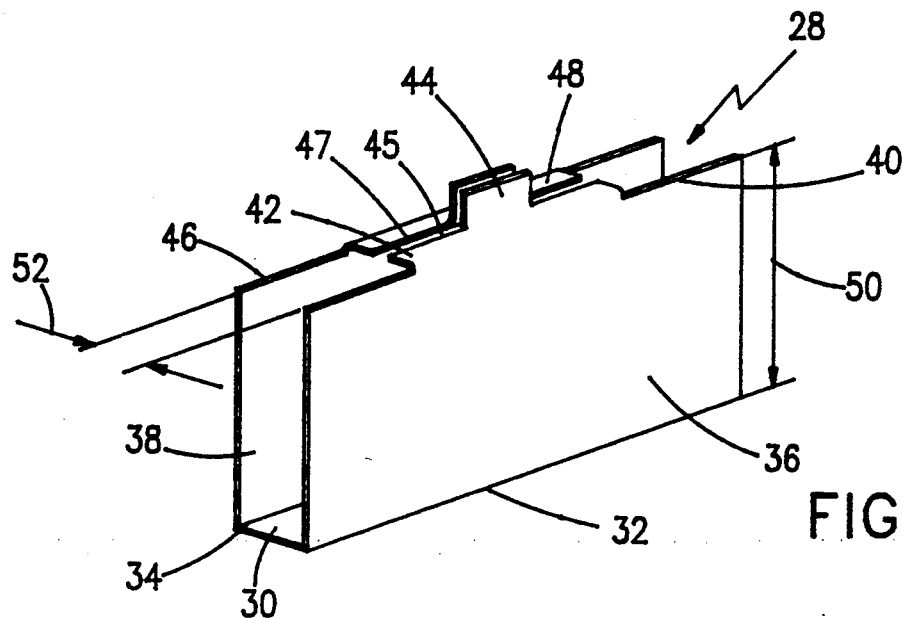
FIG. 3 shows a perspective view of one fin assembly of FIG. 1 and FIG. 2.

Each fin assembly shown in FIG. 3 has a base portion 30 which has one edge 32 and a second edge 34 to which fin-like-members 36 and 38 are attached, respectively. The fin elements or members 36 and 38 are preferably flat or planar though this is not a requirement. Fin elements 36 and 38 preferably having a rectangular shape. Fin elements 36 and 38 preferably make a 90 degree angle with respect to the base portion 30. Fin element or assembly 28 is preferably formed from a single sheet of thermally conducting material such as aluminum, copper and the like which is folded, for example, into the shape shown in FIG. 3. At an edge 40 of fin element 36 which is opposite from edge 32 of fin element 36 there is an orthogonally directed fold 42. Fold 42 has a further orthogonally and uprightly directed fold or tab 44. Fin element 38 at edge 46 which is opposite of fold 34 has an orthogonally directed fold 48. Edge 45 of fold 42 substantially meets edge 47 of fold 48 to form a spacer for the top edges 40 and 46 of fin elements 36 and 38, respectively. The preferred thickness of the sheet metal to form the fin assembly of FIG. 3 is in the range from a minimum of about 0.1 mm to a maximum of about 1 mm. The preferred material for the fin elements 36 and 38 is an aluminum sheet. The preferred height, shown by arrow 50, of each fin element 36 and 38 in the range is from a minimum of about 1 mm to a maximum of about 100 mm. The preferred spacing, shown by arrow 52, between fin element 36 and 38 is in the range from a minimum of about 0.1 mm to a maximum of about 1.0 mm for folded aluminum sheet metal.

Returning to FIGS. 1 and 2, base 30 of the plurality of fin assemblies 28 are disposed on surface 24 of plate 2. Surface 24 is referred to herein as the heat generating surface. Disposed adjacent the upper ends of fin assembly 28 having the tabs 44 (which is at the ends of the fin elements not attached to the base portion 30) is a spring element 54. Spring element or spring bias means 54 is made of a resilient material such as stainless steel 302. The preferred thickness of spring element 54 is in the range from about 0.25 mm to about 1.0 mm. Spring element 54 has a plurality of longitudinally oriented slots 56 such that the slots are generally parallel to the fin elements 36 and 38. The plurality of slots 56 of spring element 54 create a plurality of separate subspring elements 58 which are joined by the edges 60 and 62 of the spring element 54. Each of the subspring elements 58 has a smaller slot 64 therein which is adapted to receive projecting tab 44 of the fin assemblies 28. (Although the fin assemblies of FIG. 3 show two fins per fin assembly is not limited to two fins.) Spring element 54 is placed over the tabbed end of the fin assemblies with the tabs aligned and inserted in the slots 64 of the spring element 54. A cover 66 is disposed over the fin assemblies 28 and the spring element 54. The top 68 of the cover plate 66 presses down on spring element 54 to press the plurality of fin assemblies 28 towards plate 2. The cover 66 has two sides 70 and 72 with edges 71 and 73 which extend from cover top 68 preferably at a 50° angle. The cover is formed of folded sheet metal such as folded aluminum or copper sheet steel of preferred thickness in the range of from about 0.25 mm to about 1.0 mm. At the end of each side 70 and 72, which is distal from the top 68 of the cover 66, there are curled ridges 74 and 76 at edges 71 and 73 respectively curved ridges 74 and 76 grip slots 4 on opposite sides 3 and 5 of plate 2. Alternatively, the curled edges 74 and 76 grip around the bottom corners 78 and 80 of bottom plate 2 or just grip onto the sides of plate 2.

Since each fin assembly 28 has a separate subspring element 58 corresponding thereto each base 30 of the fin assemblies 28 are separately pressed against surface 24 of base plate 2 thereby providing intimate thermal contact between the bottom 82 of the collection of fin assemblies and the top surface 24 of base plate 2. Surface 24 is the heat generating surface for the collection of fin assemblies 28. Although the embodiments of FIG. 1 and FIG. 2, five fin assemblies are shown, the structure is not limited thereto.

For ease of assembly each of the fin assemblies 28 are disposed next to each other and the plurality of tabs 44 are inserted into the plurality of slots 64 in the fin assembly 54. The tabs are either bent, twisted, soldered or otherwise modified to fixedly maintain the bias plate 54 in contact with the fin assemblies.

The cover plate 66 is then disposed over the combination of the fin assemblies and spring plate 54 and the edges 84 and 86 of the spring assembly 54 are inserted into the hooks 98 and 100 in the forward and backward edges 92 and 94 respectively of the top 68 of the cover 66.

Figure 4:
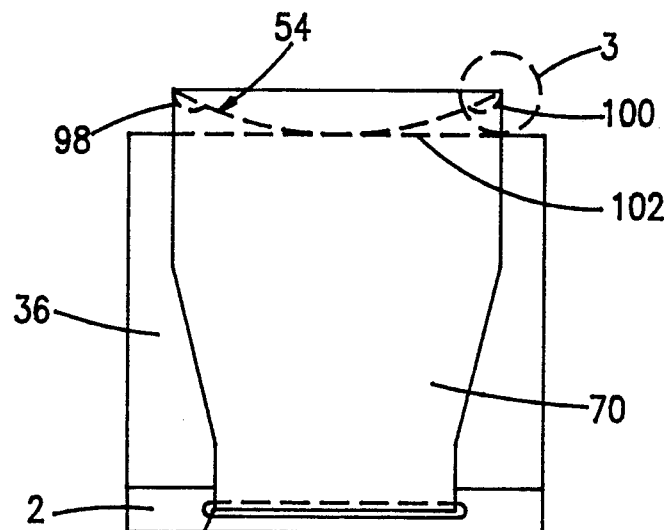
FIG. 4 is a right side view in direction 5 of FIG. 1.
Figure 6:
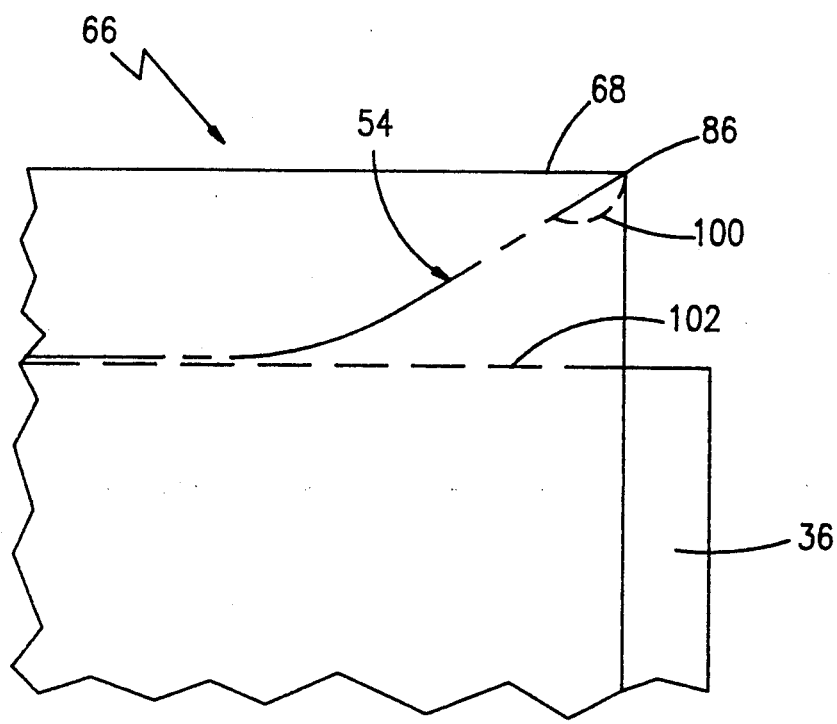
FIG. 6 shows an enlarged view of region 3 of FIG. 5.

FIG. 4 is a right side view of the structure of FIG. 1 in the direction indicated on FIGS. 1 and 2 by arrow 5. FIG. 4 shows the spring element 54 in phantom as a dot dash line and shows the top of the fin element 36 in phantom behind side 70 of cover 66 as a dashed line. The hooks 98 and 100 are shown in phantom. Region 3 in the vicinity of hook 100 is shown in expanded view in FIG. 6 with edge 86 of spring plate 54 wedged in between the hook 100 and the top 68 of the cover 66. Edge 84 of spring plate 54 is similarly wedged between cap top 68 and hook 98. The cover 66, the spring plate 54 and the plurality of fin elements or assemblies 28 now form an assembled structure which can be easily attached or clipped to the edge of bottom plate 2 or into slot 4 of bottom plate 2 by just pressing it thereover. After the structure of FIG. 1 is assembled a fluid is directed towards the structure along the direction indicated in FIG. 2 as 104. The fluid is typically air projected by a fan.

Figure 5:
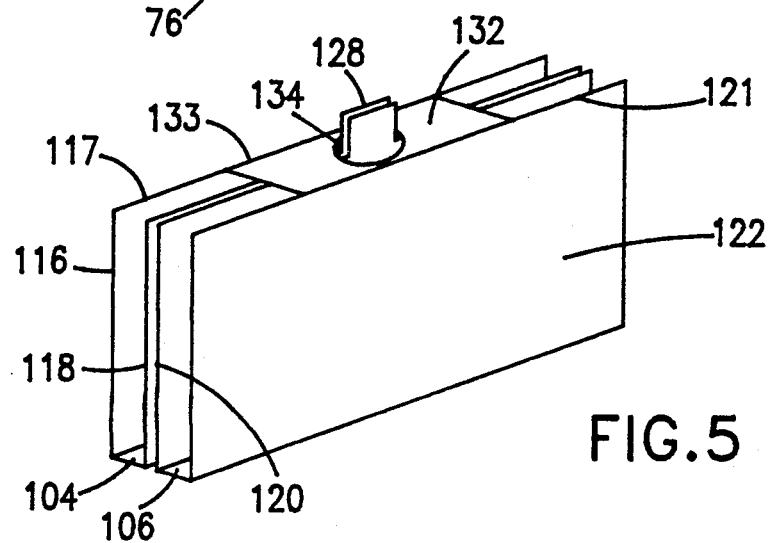
FIG. 5 is a perspective view of a multiply folded fin assembly.
Figure 7:
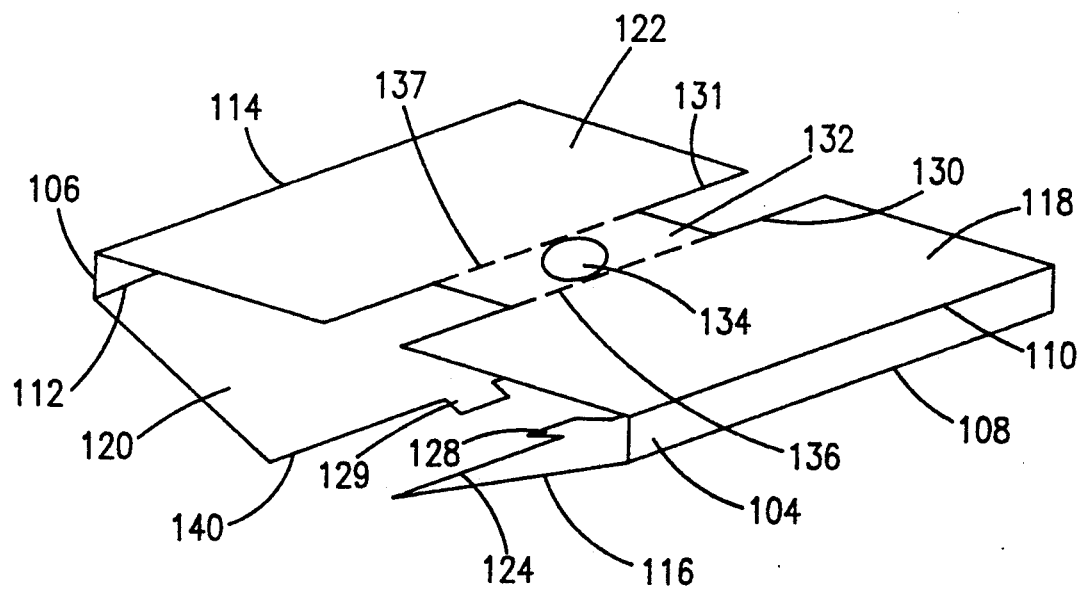
FIG. 7 shows the fin assembly of FIG. 5 partially unfolded.

FIG. 5 shows a doubly folded fin assembly as an alternate embodiment to the fin assembly 28 of FIG. 3. FIG. 7 shows the structure of FIG. 5 partially unfolded. The structure of FIG. 5 is formed from a single piece of sheet metal. There are two base portions 104 and 106. There is a fold 108 and 110 on either side of base portion 104 and there is a fold 112 and 114 on either side of base portion 106. Fin side 116 is connected to edge 108 and fin side 118 is connected to edge 110. Fin side 120 is connected to edge 112 and fin side 122 is connected to edge 114. At free edge 124 of fin side 116 there projects tab 128 at free edge 140 of fin side 120 there projects tab 129. Fin side 122 is connected to fin side 118 through a bridge 132 with an opening 134 therein. The sides of bridge 132 are folded along edges 136 and 137 which are connected to fin sides 118 and 122, respectively. When the structure of FIG. 7 is collapsed or folded to form the structure shown in FIG. 5, fin side 116 is folded up against fin side 120 and projection tabs 128 and 129 extend through aperture 134 in bridge 132. Bridge 132 forms a spacer between edge 130 and edge 131 of fin sides 118 and 122, respectively. The bases 104 and 106 are disposed against the heat generating surface in a manner similar to that of the fin assembly shown in FIG. 3.

Figure 8:
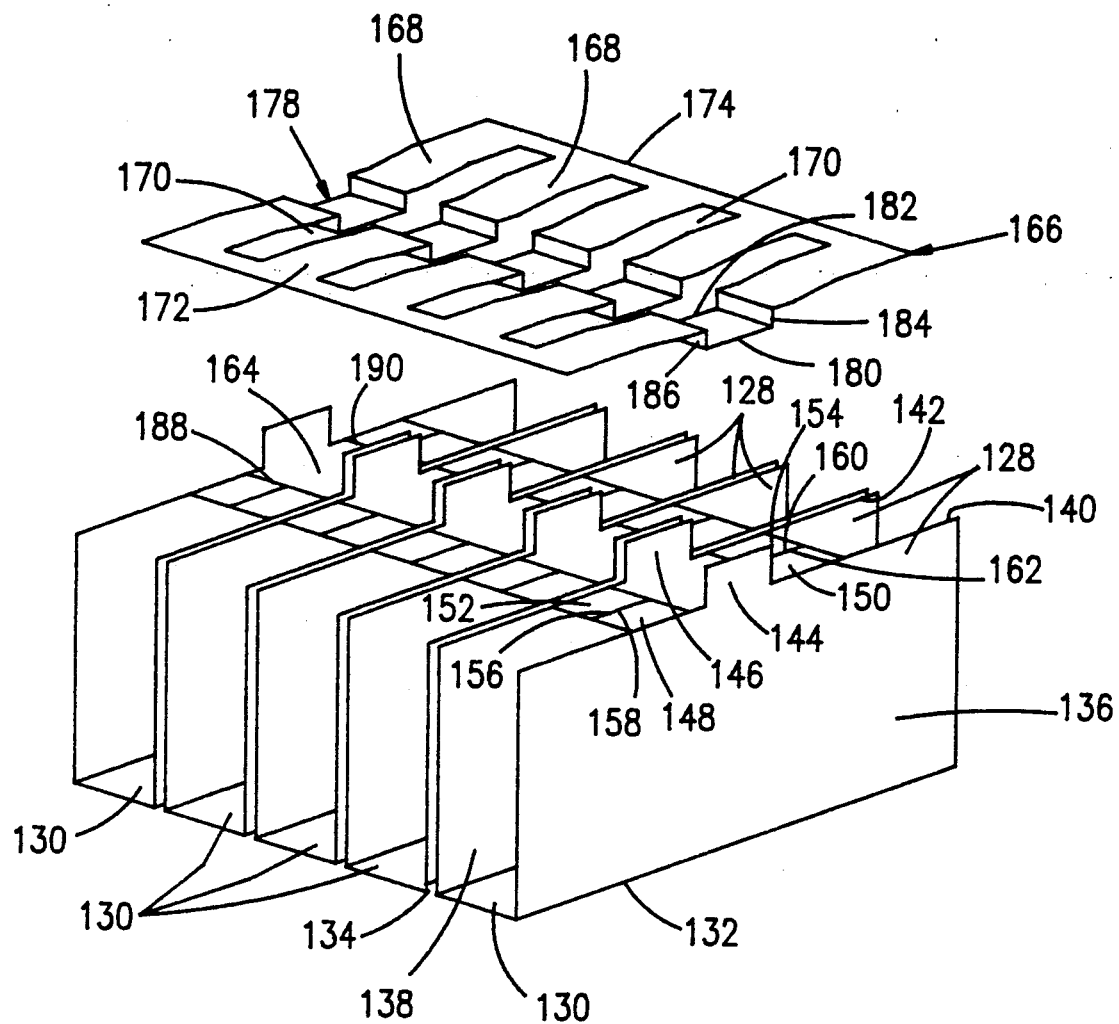
FIG. 8 is a perspective view of another embodiment of the fin assemblies and bias means wherein the biased means is folded to have a plurality of projecting regions for engagement with recesses in the folded fin assemblies.

FIG. 8 shows an alternate embodiment of the structure of the present invention. FIG. 8 has fin assemblies similar to those shown in FIGS. 1, 2, and 3, (without the cover 66 being shown) wherein there are separate fin assemblies 128 each having a base 130. Each base has edges 132 and 134. From edge 132 projects fin element 136 at preferably substantially a right angle to the base 130 and from edge 134 projects fin element 138 at substantially a right angle to the base 130. Fin element 136 has a top edge 140 and fin element 138 has a top edge 142. There is an upstanding tab 144 projecting from edge 140 and an upstanding tab 146 projecting from edge 142. From edge 140 on either side of tab 144 there are folded down tabs 148 and 150 which are folded towards edge 142. From edge 142 on either side of upstanding tab 146 there are folded down tabs 152 and 154 folded in the direction of edge 140. Tab 152 has an edge 156 and tab 148 has an edge 158 which meets a tab 156 between fin elements 136 and 138. Correspondingly, tab 154 has an edge 160 and tab 150 has an edge 162 which meets edge 160 of tab 154 at a position between fin elements 136 and 138 and a surface to receive force from subspring elements 168. The combination of fold down tabs 150, 154, 148 and 152 form a spacer for the top edges 140 and 142 of fin elements 136 and 138 respectively. Between the upstanding tabs 144 and 146 and the fold down tabs 150, 154, 148 and 152 there is formed a generally rectangular shaped opening or space or recess 164. Spring element 166 has generally the same structure and shape as the spring element 54 of FIG. 2 wherein there are subspring elements 168 formed by longitudinal slots 170. The subspring element 168 are held together by end regions 172 and 174 of the spring element 166. The subspring element 168 have a downwardly projecting region 178 which has generally rectangular cross section and is dimensioned for insertion in and engagement with space or opening 164 at the top of the fin elements 128. The upstanding tabs 144 and 146 of the fin elements 128 are disposed along the sides 180 and 182 of the rectangular region 178 in the subspring element 168 and the downwardly projecting metal sides 184 and 186 of the downwardly projecting portion 178 of subspring element 168 for engagement along edges 188 and 190 respectively of opening 164. Tabs 144 and 146 can be folded down over region 178 in the subspring element 168 to hold the fin assemblies 128 to the spring element 166.

Figure 9:
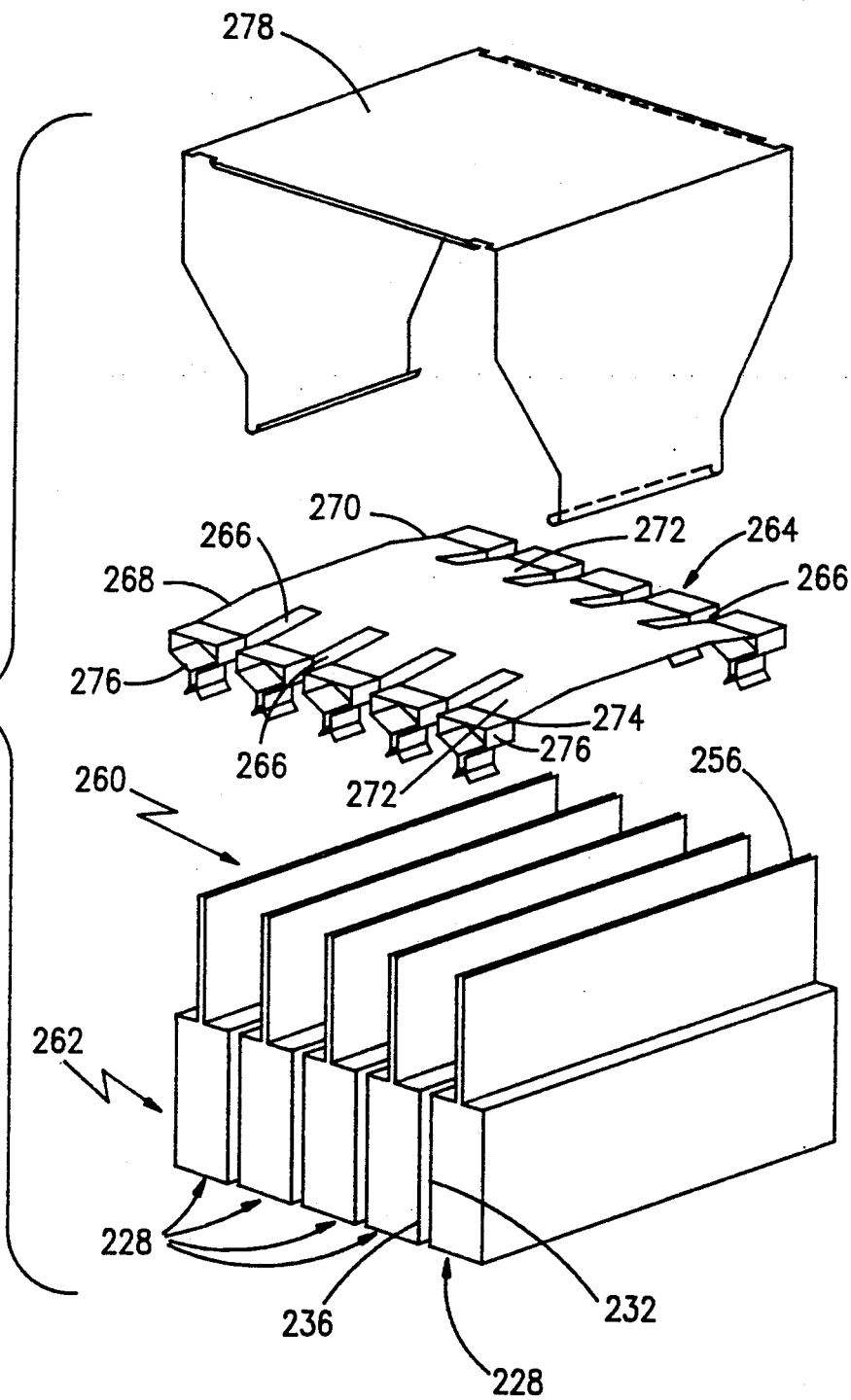
FIG. 9 is a perspective view of another embodiment of the structure according to the present invention wherein the fin assemblies are formed from sheet metal folded to have a T-like shape and wherein the spring bias means has a grip means to grip onto elongated parts of the T-shaped fin assembly.
Figure 10:
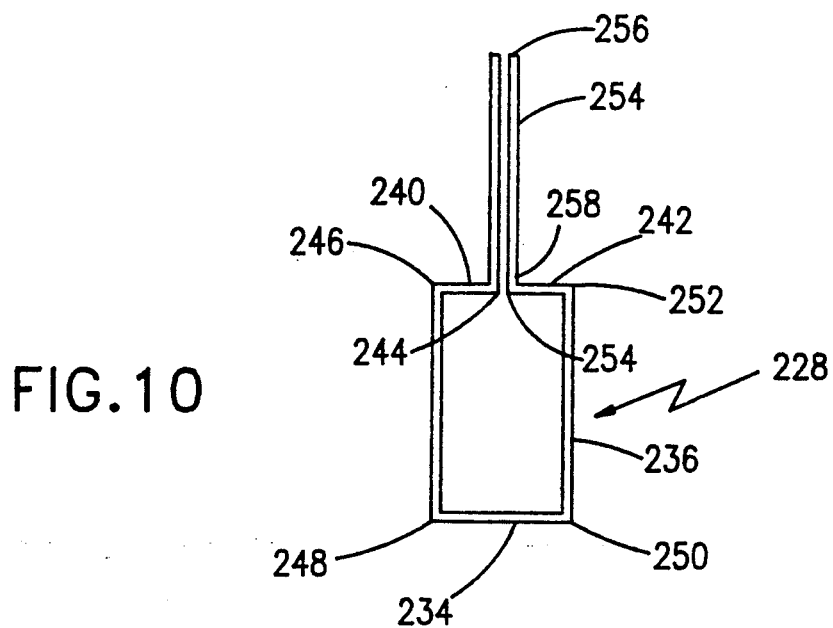
FIG. 10 shows a side view of a single fin assembly of the structure of FIG. 9.
Figure 11:
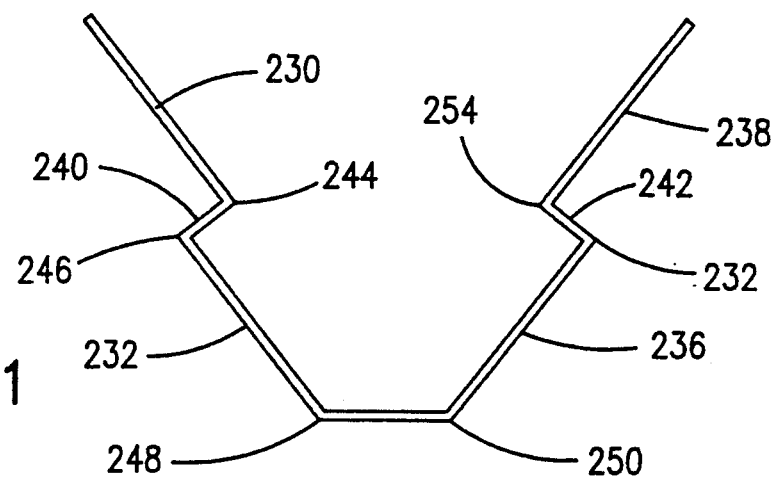
FIG. 11 shows the fin element of FIG. 10 partially unfolded.

FIG. 9 shows another alternate embodiment to the structure of FIG. 1. FIG. 9 shows the structure in partially disassembled form. FIG. 9 shows a plurality of fin assemblies 228. FIG. 10 shows a front view of one of fin assemblies 228. FIG. 11 shows the front view of FIG. 10 partially unfolded. Referring to FIGS. 10 and 11 a piece of sheet metal is folded to have a plurality of sections 230, 232, 234, 236, 238, 240 and 242. The fold is made such that when the structure is folded into the shape of FIG. 10 section 230 is adjacent section 238 and sections 240, 232, 234, 236 and 242 form a generally rectangularly shaped structure as shown in FIG. 10. The structure of FIG. 10 and 11 has folds 244 which links section 230 to section 240 at a right angle and a fold 246 which links section 240 and 232 at a right angle and a fold 248 which links section 232 and 234 at a right angle and fold 250 which links section 234 and 236 at a right angle and a fold 252 which links section 236 and 242 at a right angle. Section 238 corresponds to the base of the fin assembly. The fin assembly of FIG. 10 has generally a upside down T-shape or a fin extending from the side of a closed rectangular duct. The long or vertical portion of the T-shape 254 has a top end 256 and a bottom end 258. The bottom end 258 is connected to the horizontal portion of the T-shape which is made up of folds 244, 240, 248, 250, 252 and 254 and the five sides 240, 232, 234, 236 and 242.

Figure 12:
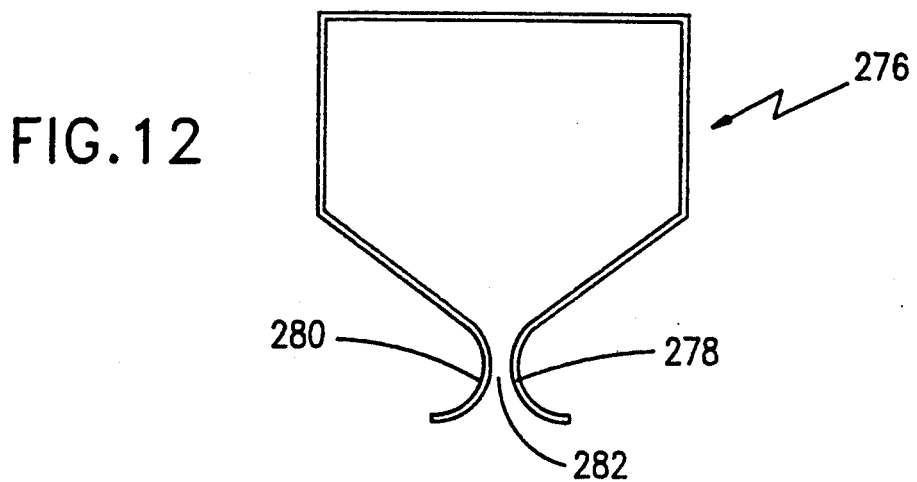
FIG. 12 shows a side view of the fin grip means of the spring element of FIG. 9.

Referring to FIG. 9, side portion 232 of one of the fin assemblies 228 is disposed against side portion 236 of an adjacent fin assembly such that there is a top region to the fin assembly 260 and a bottom region to the fin assembly 262 to form a staggered set of fins. Spring plate 264 has a downward bend as compared to the upward bend of the spring elements 54 and 166 of FIGS. 2 and 8, respectively. Spring element 264 has peripheral slots 266 on opposite edges 268 and 270 to form a plurality of finger like subspring elements 272. The subspring elements have an outward end 274 at which there is a folded clip 276 for gripping or clamping onto the top end 256 of each of the fin elements 228. The clip 276 has generally a c-shape or enclosed shape with curved ends shown in FIG. 12 as loops 278 and 280 with a space 282 therebetween into which the top 256 of fin element 228 is inserted. The housing or cover 278 is substantially the same of that in FIG. 1 and 2 except force is applied to the center area spring plate 264.

An example providing 4.0 watts per square centimeter heat dissipation is provided using the dimensions of Table I which applies to the embodiment of FIG. 1 and 2.

Fin height = 50.0 mm
Fin thickness = 0.6 mm
Fin aspect ratio = 82.0
Fin length = 66.0 mm
Number of fin members = 20
Fin spacing = 2.36 mm
Fin material = aluminum
Cover material = aluminum
Spring means = stainless steel The heat sink of Table I is capable of dissipating 4.0 w/cm$^2$ at a pressure drop of about 18,0 N/m$^2$ with a temperature rise of about 45° C. above the inlet air temperature which is directed at the structure at a speed of 10.8 liters/sec.

In summary, the inventions herein show a variety of fin assemblies wherein a portion of one fin assembly is disposed in contact with an adjacent fin assembly. The adjacent fin assemblies are slidably engaged permitting the base or bottom portion of each fin assembly to be pressed in intimate thermal contact with a heat generating surface to permit substantially enhanced thermal dissipation. The thermal dissipation is further enhanced if a thermal interface material, such as thermal paste or thermally conductive polymer, is placed between the base of the fin assembly and the heat generating surface. Moreover, substantially all elements of the heat dissipation structures are formed from folded sheet metal which results in a substantially low material and fabrication cost.

It is to be understood that the above described embodiments are simply illustrative of the principles of the invention. Various other modifications and changes may be made by those of skill in the art which will embody the principles of the invention and fall within the spirit and scope thereof.

I claim:

1. A structure for removing heat at a surface comprising:
   a plurality of fin assemblies;
   each of said plurality of fin assemblies have at least a part thereof being disposed adjacent at least a part of another of said plurality of fin assemblies so that said adjacent parts of said fin assemblies are slidably engaged with respect to each other;
   said base of each of said plurality of fin assemblies is adapted for being disposed in thermal contact with said surface;
   a bias means for biasing each of said plurality of fin assemblies towards said surface;
   a housing enclosing said fin assemblies and permitting channelling of a fluid between said fins;
   said housing is formed form folded sheet metal and has a top portion and two side portions, said housing has engagement means for holding said bias means in attachment with said housing.

2. The structure of claim 1, wherein said base of each of said fin assemblies has a first edge and a second edge, there being at least one fin attached to each of said first edge and said second edge.

3. The structure of claim 1, wherein said at least one fin is substantially planar and orthogonal to said base.

4. The structure of claim 1, wherein each of said fin assemblies has a cross section with a rectangular section from which projects at least one fin.

5. The structure of claim 1 wherein said bias means is a sheet of resilient material.

6. The structure of claim 5, wherein said sheet is slotted to form a plurality of pressing means for applying force to each of said plurality of fin assemblies there being one pressing means for each of said fin assemblies.

7. The structure of claim 6, wherein each of said pressing means has a folded region which is adapted for engagement with an opening in said fin assembly.

8. The structure of claim 6, wherein each of said pressing means has a slot for receiving a projection from each of said fin assemblies.

9. The structure of claim 1, wherein said housing has grip means for providing gripping engagement to said heat generating surface.

10. The structure of claim 9, wherein said housing is formed from folded sheet metal and has two side portions, each side portion has an outer end with a curled region which forms said grip means.

11. The structure of claim 10, wherein said curled regions engage notches on two sides of said heat generating surface to hold said housing in engagement with said surface.

12. The structure of claim 10, wherein said curled regions engage edges on at least two sides of said heat generating surface to hold said housing in engagement with said surface.

13. The structure of claim 1 wherein said bias means is fixedly attached to said housing by said engagement means.

14. The structure of claim 1, wherein said bias means is fixedly attached to said fin assemblies.

15. The structure of claim 1, wherein said bias means is fixedly attached to said fin assemblies by a pressure gripping means into which a portion of each fin assembly is inserted.

16. The structure of claim 1, wherein said engagement means comprises curled regions of said top portion of said housing.

17. The structure of claim 1, wherein said bases of each of said fin assemblies substantially covers a predetermined portion of said heat generating surface.

18. The structure of claim 1, wherein said fin assembly is formed from a piece of sheet material folded into four major sections forming fin like members, there being two base regions from each of which two of said four sections project.

19. The structure of claim 1, wherein said heat generating surface is in thermal contact with an electronic device.

20. The structure of claim 1, wherein said structure permits two dimensional thermal contact between said surface and said structure.

* * * * *